United States Patent
Cruz

(10) Patent No.: US 10,290,564 B2
(45) Date of Patent: May 14, 2019

(54) SYSTEMS AND METHODS FOR LEAD FRAME LOCKING DESIGN FEATURES

(71) Applicant: Intersil Americas LLC, Milpitas, CA (US)

(72) Inventor: Randolph Cruz, Melbourne, FL (US)

(73) Assignee: Intersil Americas LLC, Milpitas, CA (US)

(*) Notice: Subject to any disclaimer, the term of this patent is extended or adjusted under 35 U.S.C. 154(b) by 0 days.

(21) Appl. No.: 15/668,527

(22) Filed: Aug. 3, 2017

(65) Prior Publication Data
US 2017/0330823 A1 Nov. 16, 2017

Related U.S. Application Data

(62) Division of application No. 14/829,584, filed on Aug. 18, 2015, now Pat. No. 9,728,491, which is a division of application No. 13/932,076, filed on Jul. 1, 2013, now Pat. No. 9,165,863, which is a division of
(Continued)

(51) Int. Cl.
*H01L 23/495* (2006.01)
*H01L 23/31* (2006.01)
*H01L 21/48* (2006.01)

(52) U.S. Cl.
CPC .... *H01L 23/49548* (2013.01); *H01L 21/4828* (2013.01); *H01L 23/3114* (2013.01); *H01L 23/495* (2013.01); *H01L 23/49503* (2013.01); *H01L 23/49541* (2013.01); *H01L 23/3107* (2013.01); *H01L 2224/32245* (2013.01)

(58) Field of Classification Search
CPC ............ H01L 23/495; H01L 23/49503; H01L 23/49548; H01L 23/3107; H01L 23/49544; H01L 21/4828; H01L 2224/32245
See application file for complete search history.

(56) References Cited

U.S. PATENT DOCUMENTS 6,091,135 A 7/2000 Lee
7,217,599 B2 5/2007 Punzalan et al.
(Continued)

FOREIGN PATENT DOCUMENTS

CN 1862797 A 11/2006
CN 101218673 A 7/2008
CN 101882609 A 11/2010

OTHER PUBLICATIONS

Chowdhury, Asif et al., "The Effect of Die Attach Layer Delamination on the Thermal Performance of Plastic Packages", May 1998, Publisher: R&D Center, Anam Semiconductor and Amkor Electronics, 8 pages.

*Primary Examiner* — Tucker J Wright
(74) *Attorney, Agent, or Firm* — Foley & Lardner LLP

(57) ABSTRACT

Systems and methods for lead frame locking design features are provided. In one embodiment, a method comprises: fabricating a lead frame for a chip package, the lead frame having a paddle comprising a step-out bottom locking feature profile across at least a first segment of an edge of the paddle that provides an interface with a mold compound; etching the paddle to have at least a second segment of the edge having either an extended-step-out bottom locking feature profile or an overhanging top locking feature profile; and alternating first and second segments along the edge of the paddle.

11 Claims, 24 Drawing Sheets

Related U.S. Application Data application No. 13/446,489, filed on Apr. 13, 2012, now Pat. No. 8,497,165.

(60) Provisional application No. 61/549,523, filed on Oct. 20, 2011.

(56) References Cited

U.S. PATENT DOCUMENTS

| | | | |
|---|---|---|---|
| 7,556,987 B2 * | 7/2009 | Dimaano, Jr. | H01L 21/4828 257/669 |
| 7,872,345 B2 | 1/2011 | Chow et al. | |
| 2002/0163001 A1 | 11/2002 | Shaddock | |
| 2002/0163015 A1 * | 11/2002 | Lee | H01L 23/3107 257/200 |
| 2004/0252096 A1 * | 12/2004 | Wang | G09G 3/3208 345/102 |
| 2006/0255438 A1 | 11/2006 | Omori et al. | |
| 2009/0152696 A1 | 6/2009 | Dimasacat et al. | |
| 2009/0230529 A1 | 9/2009 | Dimaano et al. | |
| 2010/0283135 A1 | 11/2010 | Yao et al. | |
| 2010/0295161 A1 | 11/2010 | Koduri | |

* cited by examiner

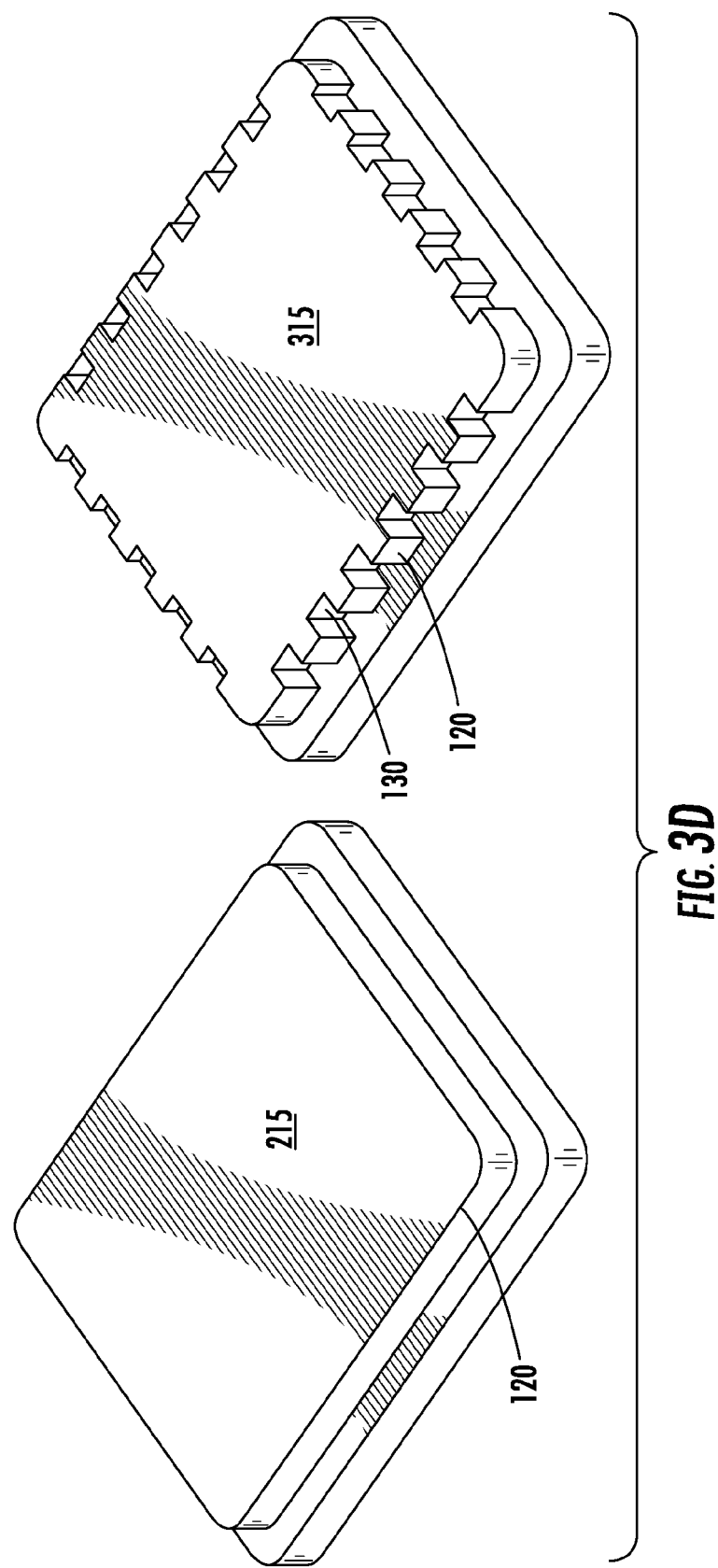

SYSTEMS AND METHODS FOR LEAD FRAME LOCKING DESIGN FEATURES

CROSS-REFERENCE TO RELATED APPLICATIONS

The present application is a divisional application of U.S. Non-Provisional application Ser. No. 14/829,584, filed Aug. 18, 2015, now U.S. Pat. No. 9,728,491, which application is a divisional application of U.S. Non-Provisional application Ser. No. 13/932,076, filed on Jul. 1, 2013, now U.S. Pat. No. 9,165,863, which application is a divisional application of U.S. Non-Provisional application Ser. No. 13/446,489, filed on Apr. 13, 2012, now U.S. Pat. No. 8,497,165, which application claims the benefit of and priority to U.S. Provisional Application No. 61/549,523, filed on Oct. 20, 2011, all of such applications being incorporated herein by reference in their entirety.

BRIEF DESCRIPTION OF THE DRAWINGS

Embodiments of the present invention can be more easily understood and further advantages and uses thereof more readily apparent, when considered in view of the description of the preferred embodiments and the following figures in which:

FIGS. 3A-3D are diagrams illustrating a surface breaking locking feature of one or more embodiments of the present invention;

In accordance with common practice, the various described features are not drawn to scale but are drawn to emphasize features relevant to the present invention. Reference characters denote like elements throughout figures and text.

DETAILED DESCRIPTION

Figure 1A:
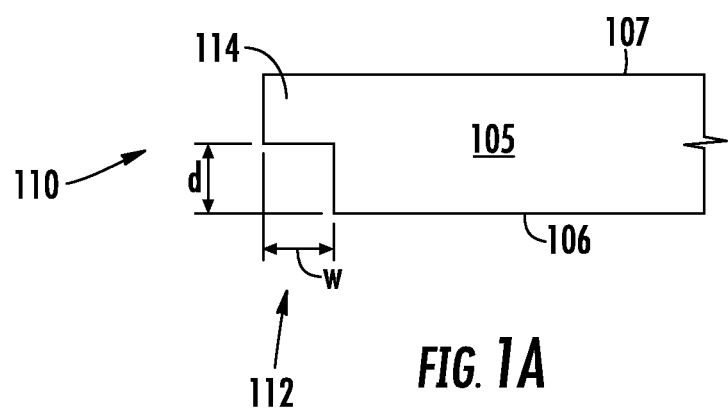
FIGS. 1A-1C are profile views illustrating different topographies of surface breaking locking features utilized in one or more embodiments of the present invention.

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Embodiments of the present invention provide systems and methods to address delamination and cracking of chip packages (such as for an integrated circuit, semiconductor, or other silicon devices) caused by the buildup of shear and flexing stresses that tend to form where a lead frame of a chip package is anchored to the molding compound that encapsulates one or more die and the lead frame within the chip package. This is accomplished through the introduction of novel mechanical paddle surface breaking locking features that interlock the molding compound to the paddle. Such stresses may be caused by, for example, thermal stresses from ambient environment and/or component thermal cycling, high electrical loads, high temperature thermal environments, shock loads applied during installation of the chip package. The effects of stresses such as these, as well as other causes, can be mitigated based on the techniques illustrated by embodiments described in this disclosure.

As the term is used herein, a lead frame provides mechanical support to a device (such as for a die, for example) and comprises a paddle to which the die is attached, and leads, which provide for external electrical connections. For example, the die may be connected to the leads by wirebonding or other connection means. Package interfacial shear stress can induce lead frame and molding compound delamination. Package induced flexing stress can increase over 4× at the lead frame thermal pad edge in the presence of delamination. Thus, by preventing delamination, embodiments of the present invention work towards reducing stress and eliminating package cracks. Addressing delaminating can be particularly critical for products using die attach adhesive material with high Young modulus properties (such as solder, for example) widely used in many power products for its improved electrical and thermal performance. By addressing the delamination condition, tensile stresses can be managed to not increase beyond the encapsulation material flexural strength thus preventing package cracks.

Embodiments of the present invention can be implemented in any lead frame based chip package (such as, but not limited to Power Quad Flat No-lead (PQFN), Quad Flat No-Lea (QFN), small-outline integrated circuit (SOIC), thin-shrink small outline package (TSSOP), Quarter Small-Outline Package (QSOP), Shrink small-outline package (SSOP), etc) to address interfacial delamination and Moisture Sensitivity Level (MSL) problems and eliminate package encapsulation cracks. Further, the design features presented herein can be used to compliment other MSL improvement techniques to further optimize performance.

Figure 1B:
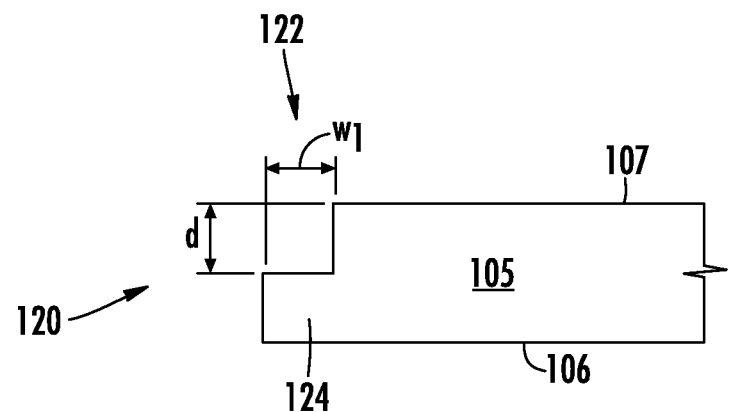
Figure 1C:
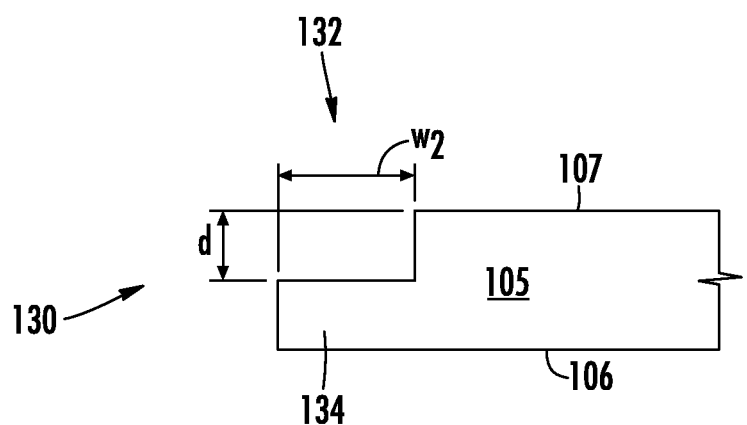

FIGS. 1A to 1C are diagrams introducing different topographies of locking features (shown at 110, 120, and 130) utilized by one or more embodiments of the present invention. Each figure is drawn from a cross-sectional profile view of illustrating an edge of paddle 105 where surface 107 is the top surface (for example, where a die may be mounted as shown in subsequent Figures) and surface 106 is the bottom surface. These topographies, when implemented within a chip package, each function to reduce the shear stress at the edges of the paddle to prevent the onset of delamination. That is, the use of these surface breaking locking features improves the mechanical interlocking at the interface where the paddle meets the molding compound, thus reducing the chances of delamination and the formation of cracks in the chip package.

A first locking feature profile, illustrated in FIG. 1A generally at 110, illustrates an edge of a paddle 105 comprising what is referred to herein as an overhanging-top locking feature profile. Overhanging-top locking feature profile 110 is characterized by a partial etching 112 along the edge of, and into the bottom surface 106 of paddle 105 that results in an overhang 114 from the top surface 107 that overhangs the partial etching 112. In one embodiment, overhanging-top locking feature profile 110 is formed by etching to a depth "d" of 0.100±0.030 mm into paddle 105 from the bottom surface 106 to form the overhang 114 having a width "w" of 0.050±0.006 mm.

A second locking feature profile, illustrated in FIG. 1B generally at 120, illustrates an edge of paddle 105 comprising what is referred to herein as a step-out bottom locking feature profile. Step-out bottom locking feature profile 120 is characterized by a partial etching 122 along the edge of, and into the top surface 107 of paddle 105 (shown by width $w_1$) that results in a step-out 124 from the bottom surface 106. In one embodiment, step-out bottom locking feature profile 120 is formed by etching to a depth "d" of 0.127±0.050 mm into paddle 105 from the top surface 107 to form the step-out 124 having a width $w_1$ of 0.050±0.006 mm.

A third locking feature profile, illustrated in FIG. 1C generally at 130, illustrates an edge of a paddle 105 comprising what is referred to herein as an extended edge step-out bottom locking feature profile. An extended edge step-out bottom locking profile 130 is a form of step-out bottom locking feature profile 120 that is intended for use in combination with step-out bottom locking feature profile 120. Extended edge step-out bottom locking profile 130 is characterized by a partial etching 132 along the edge of, and into the top surface 107 that has greater width (shown as width $w_2$) than the width $w_1$ of partial etching 122. This results in a step-out 134 from the bottom surface 106 of paddle 105 that has a greater width than step-out 124. In one embodiment, step-out bottom locking feature profile 120 is formed by etching to a depth "d" of 0.127±0.050 mm into paddle 105 from the top surface 107 to form the step-out 134 having a width $w_1$ of 0.150±0.006 mm.

Paddles for chip packages may be fabricated to comprise locking features formed from various combinations of locking feature profiles 110, 120 and 130. When arranged as described in the various embodiments below, theses paddle locking features 110, 120 and 130 implement surface breaking patterns along the edge of the paddle 105 that prevents package crack initiation and propagation by improving interlocking and stress redistribution.

In some embodiments, lead frames may be constructed from flat sheet metal either by stamping or etching. Etching to form locking feature profiles 110, 120 and 130 involves selectively covering a sheet metal with photoresist in accordance with the desired pattern of the lead frame. The sheet metal is then exposed to chemical etchants that remove areas not covered by photoresist. After the etching process, the etched frames are singulated into strips. Stamping is a mechanical process that employs die and punch sets to progressively achieve the intended locking feature profiles 110, 120 and 130 through a series of stamping/punching steps. For some embodiments, after stamping or etching, the lead frame is then finished with cleaning, silver-plating, taping and downsetting steps. Silver-plating may be done on the bonding fingers and die pad to improve wirebond and die attach quality. Taping may include putting a lead lock tape over the leads to prevent lead deformation, while downsetting may include of pushing the paddle down relative to the bonding fingers in compliance with standard industry requirements. Although this disclosure primarily discusses paddle locking features 110, 120 and 130 in terms of having "etched" overhang and step-out features, one of ordinary skill in the art upon reading this disclosure would appreciate that any of the overhang and step-out features discussed in this application may be formed by stamping rather than etching.

Figure 2A:
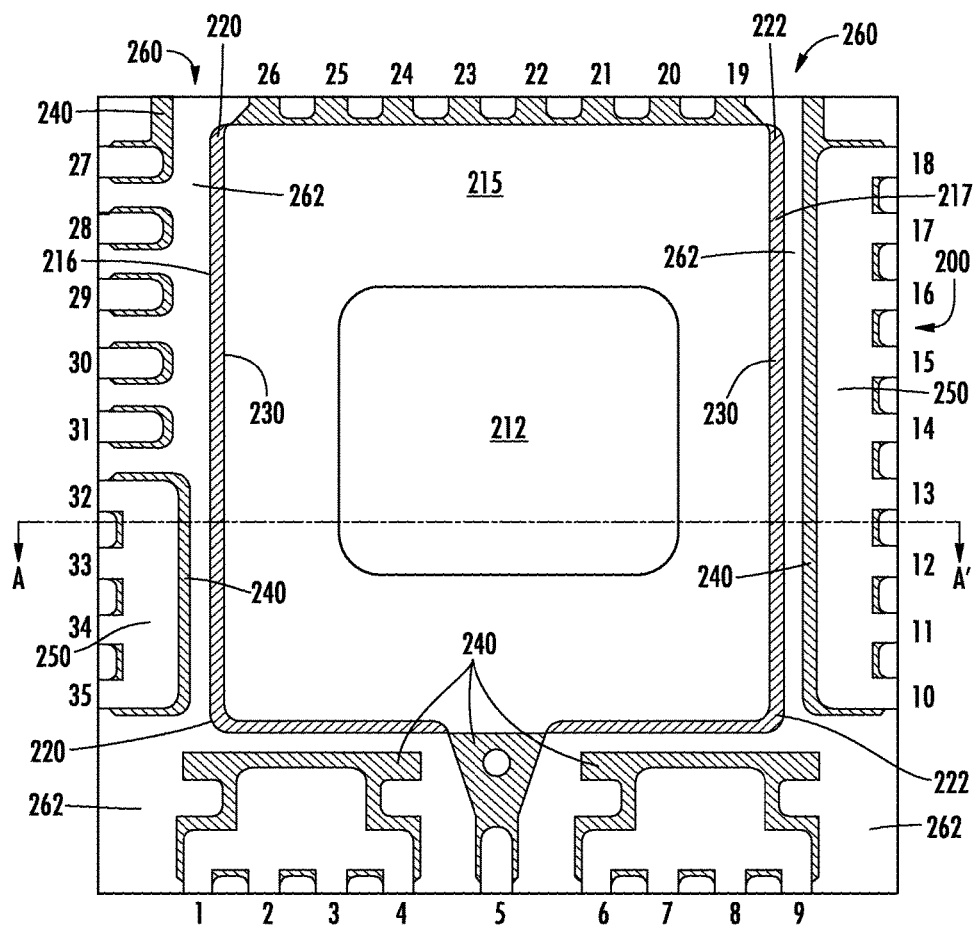
FIGS. 2A-2D are diagrams illustrating a surface breaking locking feature of one or more embodiments of the present invention.
Figure 2B:
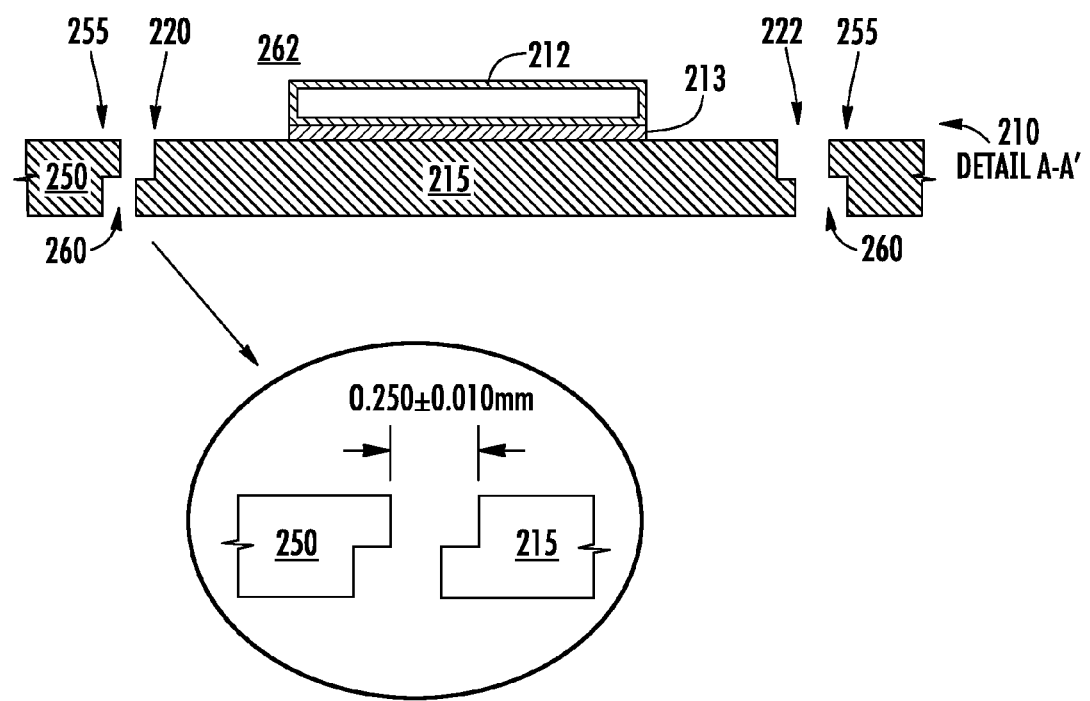

FIGS. 2A-2D are diagrams illustrating a chip package 200 of one embodiment of the present invention. Shown generally by the cross-sectional view 210 in FIG. 2B, at least one die 212 is secured to a paddle 215 by a die attach material 213 (which may be, for example, a solder or epoxy adhesive). FIG. 2A illustrates at 230 the partial etching of edges 216 and 217 etched from the top surface of paddle 215. The edges 216 and 217 of paddle 215 each comprise a linear step-out bottom locking feature, shown at 220 and 222. That is, the entire edge 216 of the paddle 215 has been partially etched from the top (shown in view 205 by top partial etches 230) to have a profile as shown by step-out bottom locking feature profile 120. Similarly, the entire edge 217 of paddle 215 has been partially etched from the top (shown in view 205 by top partial etches 230) to have a profile as shown by step-out bottom locking feature profile 110.

Figure 2C:
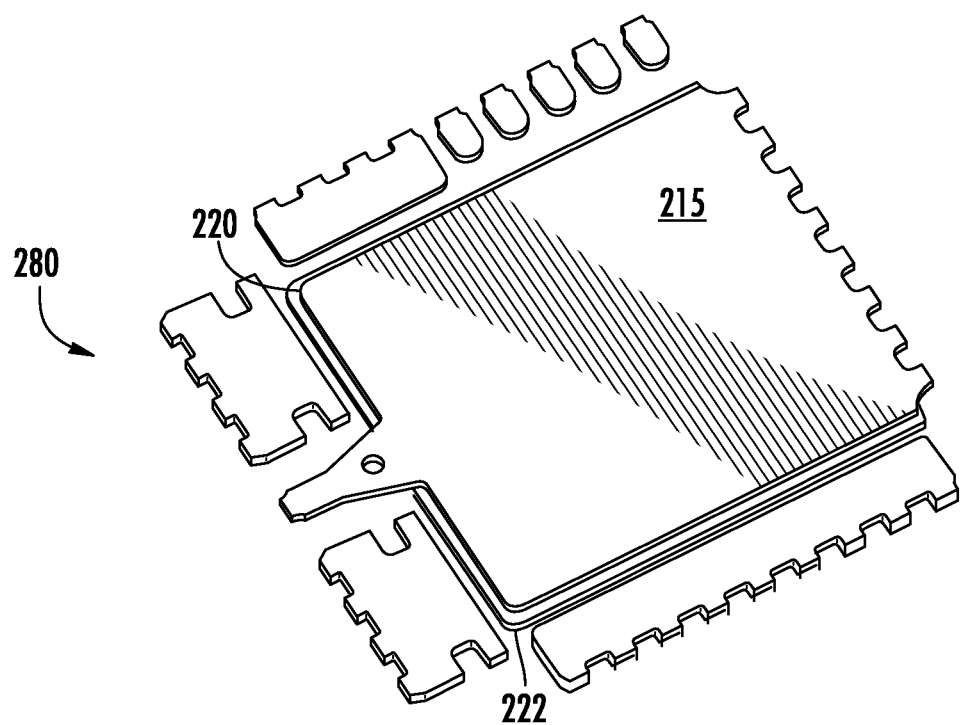
Figure 2D:
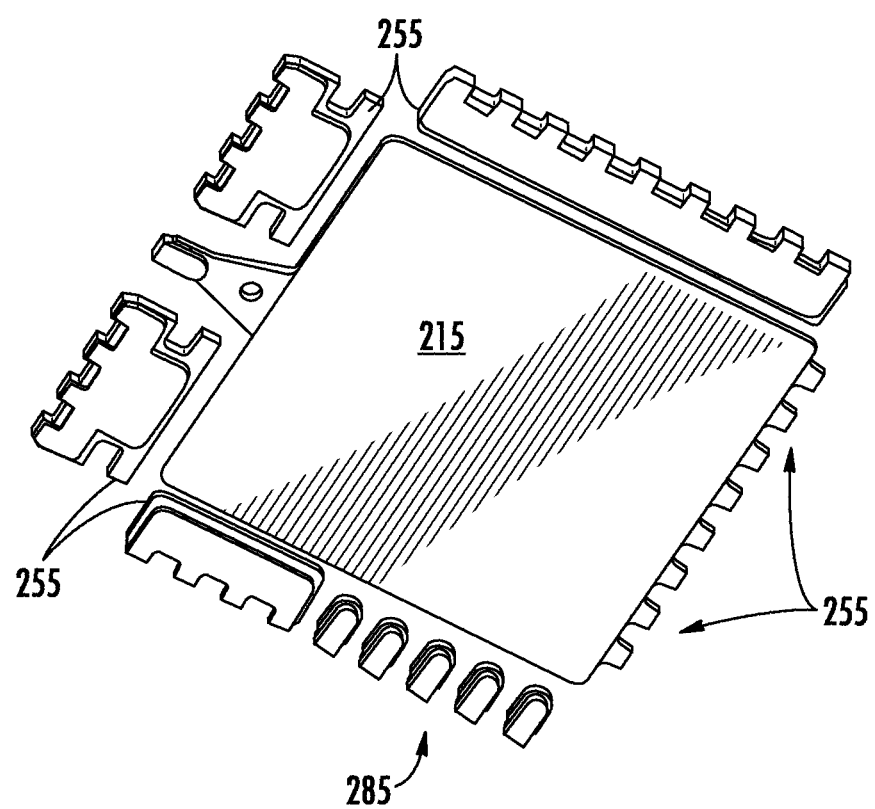

Bottom partial etches 240 are also illustrated where partial etching is performed from the bottom surface of paddle 215. For example, in one embodiment, one or more secondary elements 250 are partially etched from the bottom to provide those elements with overhanging-top locking features (such as shown at 255 in FIG. 2B). The volume 260 between the locking features 220 and 255 is filled with a molding compound 262 which fills the partially etched regions 230 and 240, thus anchoring the paddle 215 and die 212 to the molding compound 262 within chip package 200. FIG. 2C at 280 provides a top angled view of paddle 215 illustrating the linear step-out bottom locking features 220 and 222. FIG. 2D at 285 provides a bottom angled vie of paddle 215 illustrating the Step-out bottom locking features 255. These features are described as being "linear" in the sense that edges 216 and 217 form a continuous line.

Figure 3A:
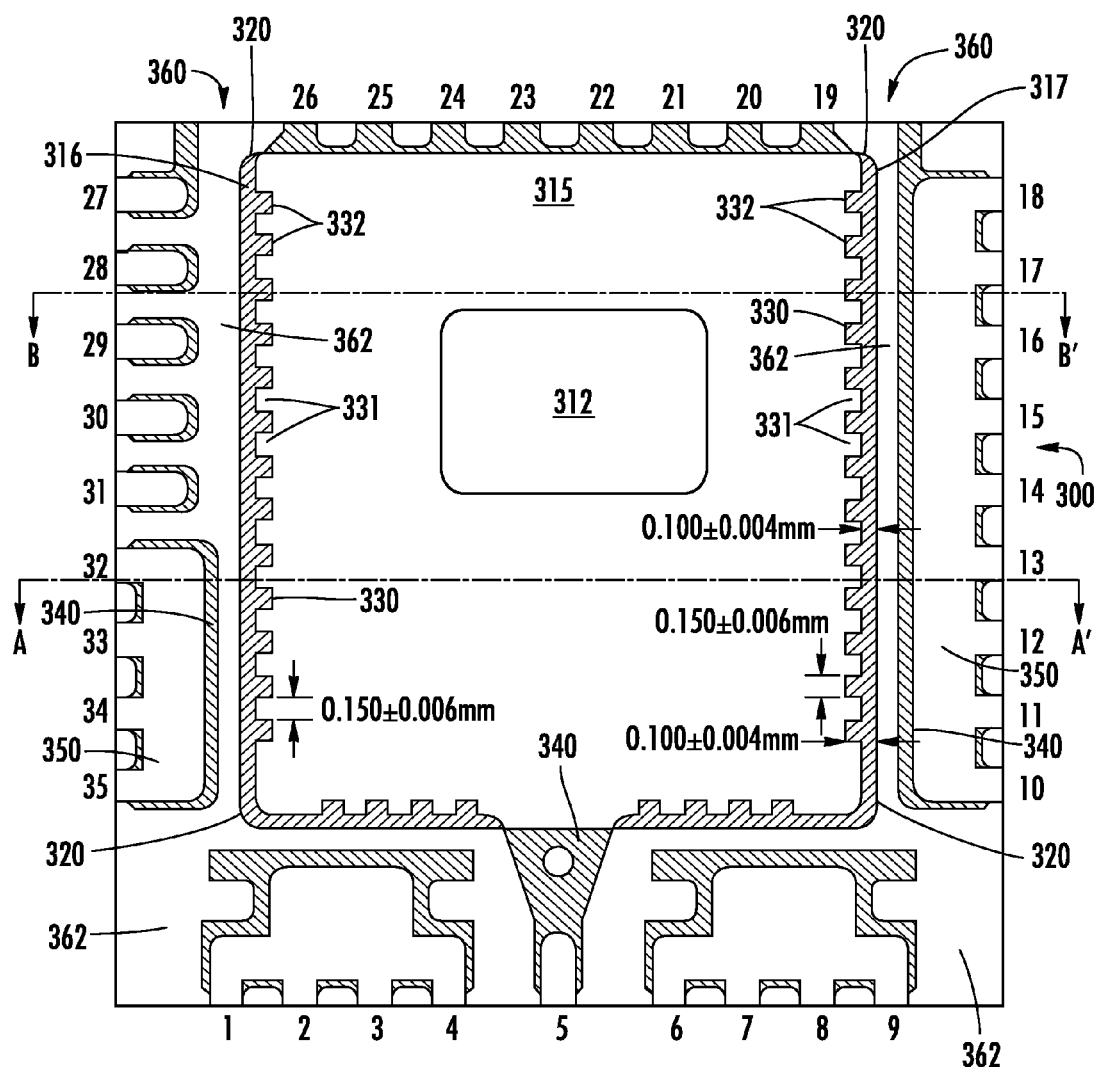
Figure 3B:
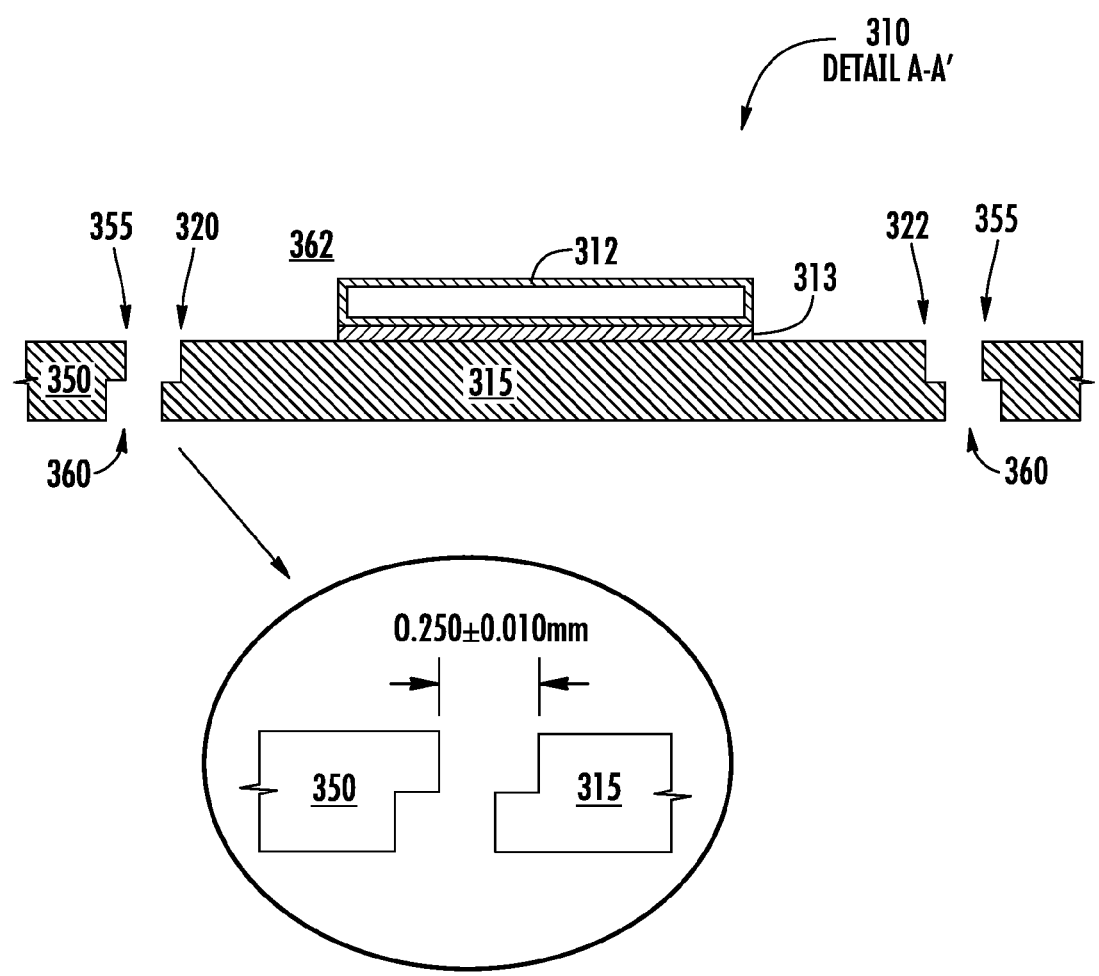
Figure 3C:
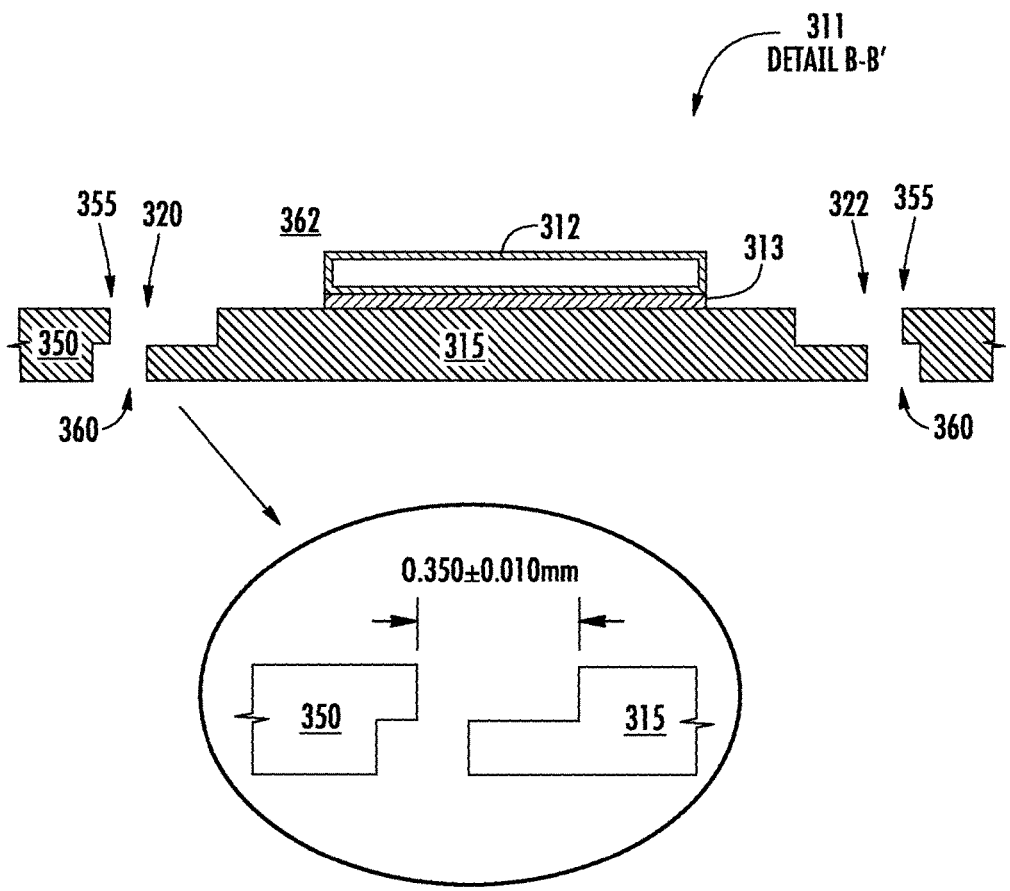

FIGS. 3A-3D illustrate a locking feature formed from combining different profile segments to form a discontinuous edge rather than a linear edge. FIG. 3A illustrates a top view of a chip package 300 according to one embodiment of the present invention. FIGS. 3B and 3C illustrate respective cross-sectional views 310 and 311 of chip package 300 In this embodiment, at least one die 312 is secured to a paddle 315 by a die attach material 313 (which may be, for example, a solder or epoxy adhesive). Edges 316 and 317 of paddle 315 each comprise what is referred to herein as a discontinuous step-out bottom locking feature, shown at 320 and 322.

FIG. 3A illustrates the partial etching of edges 316 and 317 etched from the top surface of paddle 315. Segments 331 comprise lengths of edges 316 and 317 having a step-out bottom locking feature profile 120. Segments 332 comprise lengths of edges 316 and 317 having an extended-step-out bottom locking feature profile 130. In one embodiment, bottom partial etches 340 are also illustrated where partial etching is performed from the bottom surface of paddle 315. For example, in one embodiment, one or more secondary elements 350 are partially etched from the bottom to provide those elements with overhanging-top locking features (such as shown at 355 in FIGS. 3B and 3C). The volume 360 between the locking features 320/322 and 355 is filled with a molding compound 362 which fills the partially etched regions of locking features 320/322 and 340, thus anchoring the paddle 315 and die 312 to the molding compound 362 within chip package 300.

As illustrated in FIG. 3A, edge 316 of the paddle 315 has been partially etched from the top (shown as top partial etches 330) to have a profile that combines alternating segments of step-out bottom locking feature profile 120 (shown in FIG. 3B) and extended-step-out bottom locking feature profile 130 (shown in FIG. 3C). Similarly, edge 317 of paddle 315 has been partially etched from the top (shown as top partial etches 330) to have a profile that combines alternating surface breaking segments of step-out bottom locking feature profile 120 (shown in FIG. 3B) and extended-step-out bottom locking feature profile 130 (shown in FIG. 3C).

By combining alternating surface breaking segments 331 and 332 having these different profiles, the result is a discontinuous interface at the top of paddle 315 between paddle 315 and molding compound 362. In other words, the resulting interface is not a continuous line but has discontinuities from segment to segment. FIG. 3D provides a simplified comparison of a linear edge of paddle such as paddle 215 versus the discontinuous edge of a paddle such as paddle 315. As compared to the linear locking feature of FIGS. 2A and 2B, the surface tension required to cause delamination and break the molding compound is increased in a discontinuous interface due to the greater distance for said tensions to travel along the edge of the paddle 315. Further, the discontinuous pattern requires stresses at the molding compound-paddle interface to change direction to further propagate, further hindering such propagation. The discontinuous shape design feature serves as a delamination stopper. If there is a localized delamination that occurs, the discontinuous locking feature will contain it preventing it from freely propagating. For this reason, the discontinuous shape locking feature also serves to crack initiation. Generally, the discontinuous shape locking feature facilitates mechanical interlocking between the molding compound and the lead frame at the interface at critical stress concentration areas where these elements interface. Thus the locking feature comprising of surface breaking alternating patterns along the edge of the die attach paddle 315 prevents package delamination and crack initiation and propagation by improving molding compound to paddle interlocking and stress redistribution.

Figure 4A:
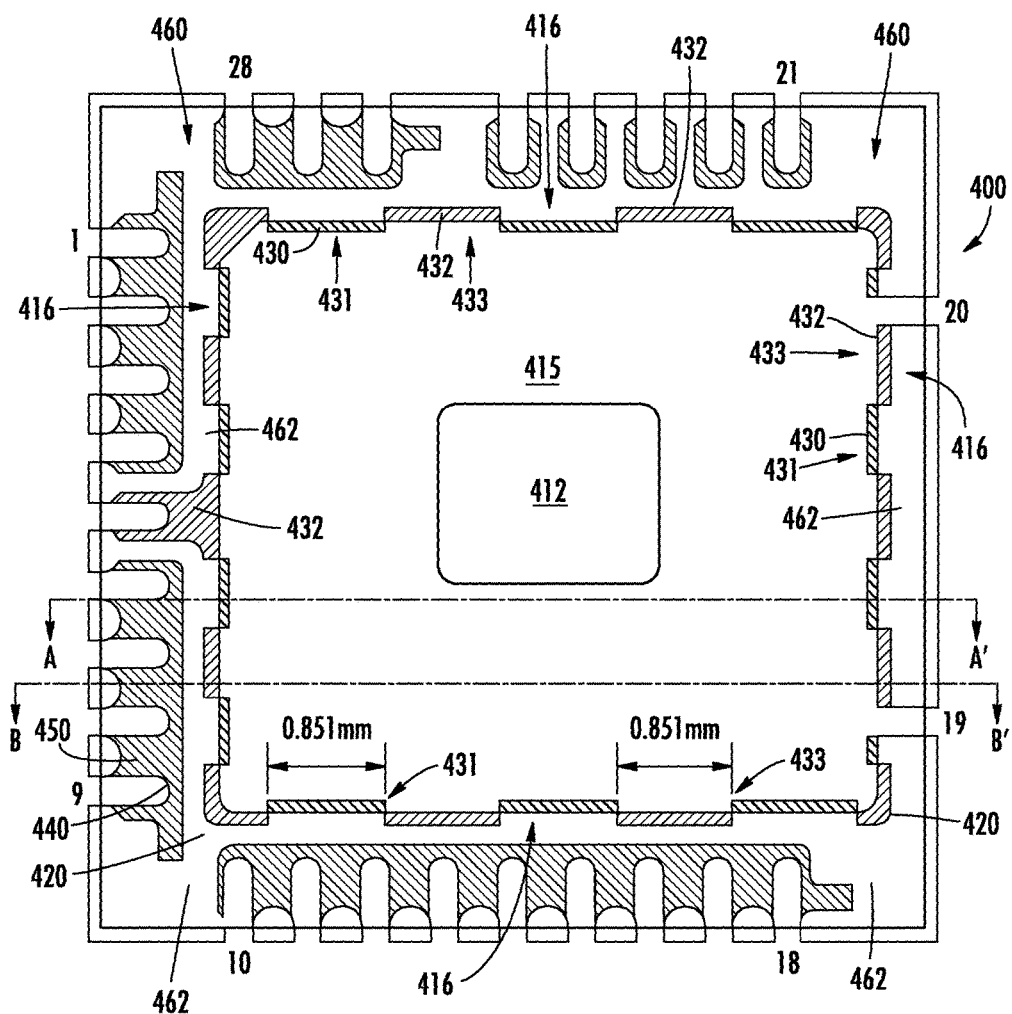
FIGS. 4A-4G are diagrams illustrating a surface breaking locking feature of one or more embodiments of the present invention.
Figure 4B:
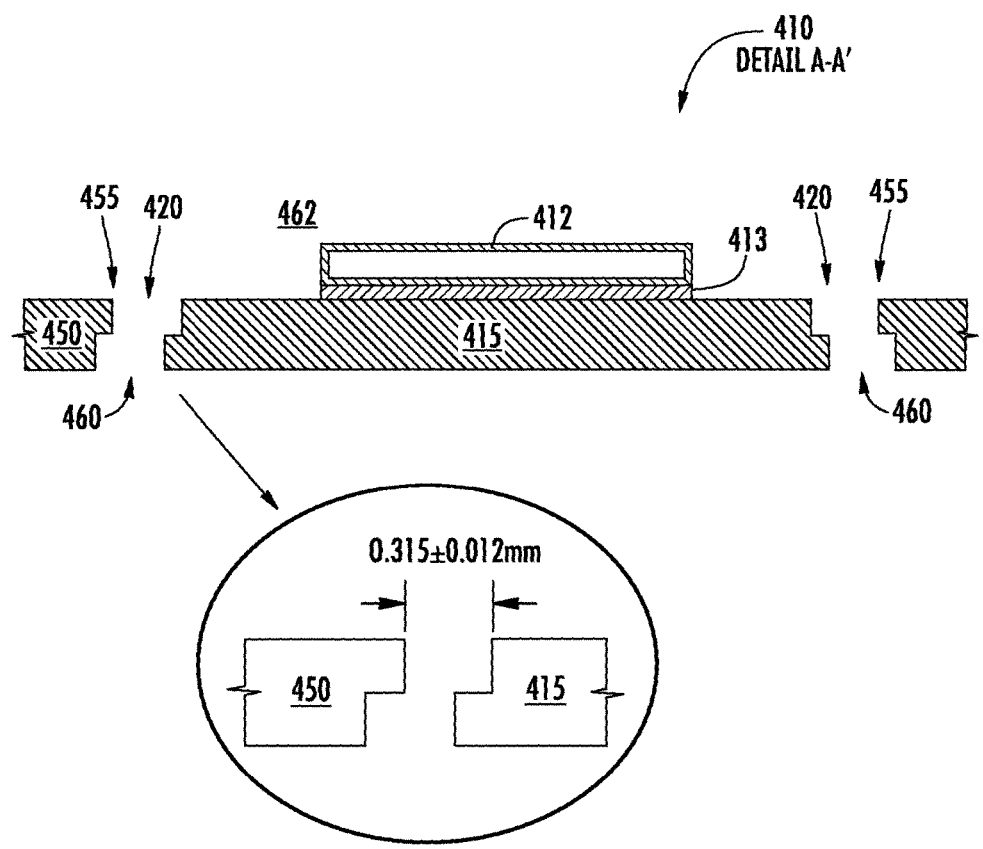
Figure 4C:
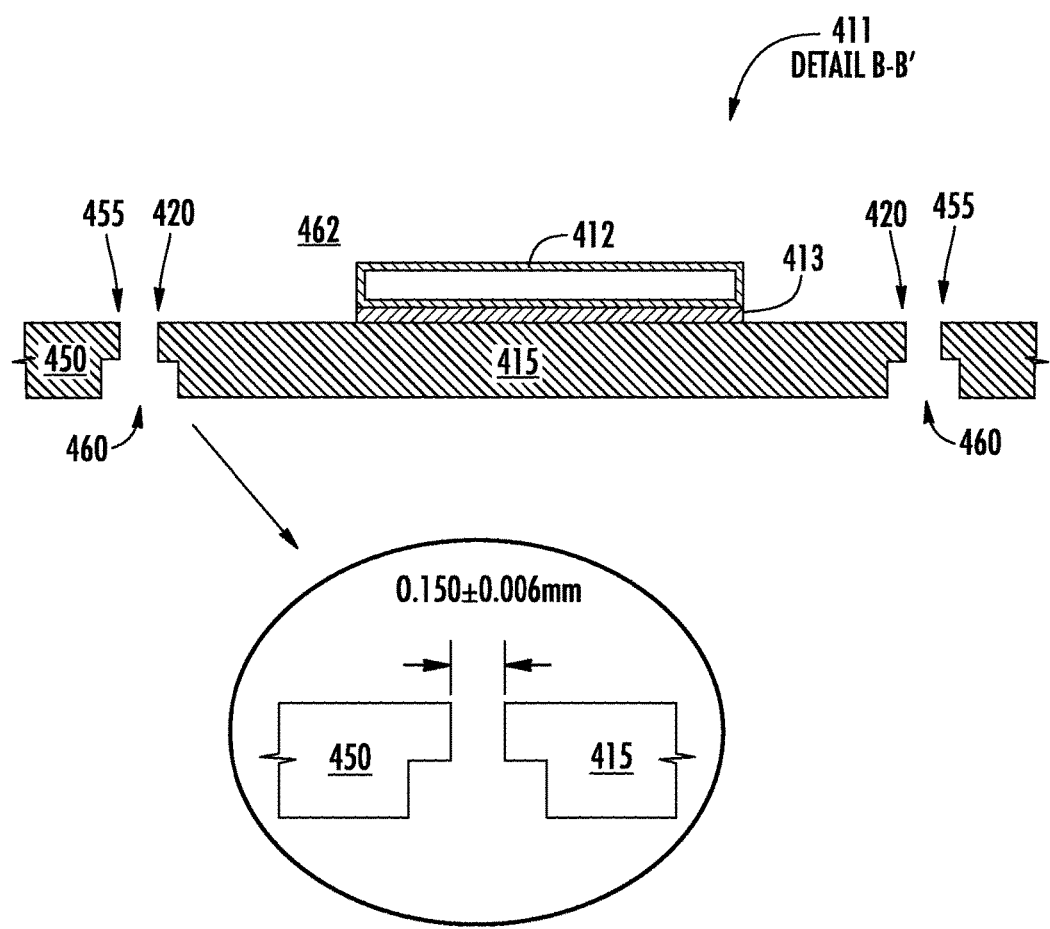

FIGS. 4A-4G illustrate other embodiments having a locking feature formed from combining different profile segments to form a discontinuous edge rather than a linear edge. FIG. 4A illustrates a top view of a chip package 400. FIGS. 4B and 4C provide cross-sectional views 410 and 411 of chip package 400. In this embodiment, at least one die 412 is secured to a paddle 415 by a die attach material 413 (which may be, for example, a solder or epoxy adhesive). Edges 416 are fabricated to include what is referred to herein as a discontinuous over-hanging top locking feature, shown at 420. That is, the edges 416 of the paddle 415 have been partially etched from the top (shown as top partial etches 430) and from the bottom (shown in as bottom partial etches 432) to have a profile formed by combining alternating surface breaking segments of step-out bottom locking feature profile 120 (shown at 410 in FIG. 4B) and over-hanging top locking feature profile 110 (shown at 411 in FIG. 4C). Segments 433 comprise lengths of edges 416 having an over-hanging top locking feature profile 110 while segments 431 comprise lengths of edges 416 having a step-out bottom locking feature profile 130.

Bottom partial etches 440 are also illustrated in FIG. 4A where partial etching is performed from the bottom surface of paddle 415. For example, in one embodiment, one or more secondary elements 450 are partially etched from the bottom to provide those elements with overhanging-top locking features 455 (as shown in FIGS. 4B and 4C). The volume 460 between the locking features 420 and 455 is filled with a molding compound 462 which fills the partially etched regions 430, 432 and 440, thus anchoring the paddle 415 and die 412 to the molding compound 462 within chip package 400.

Figure 4D:
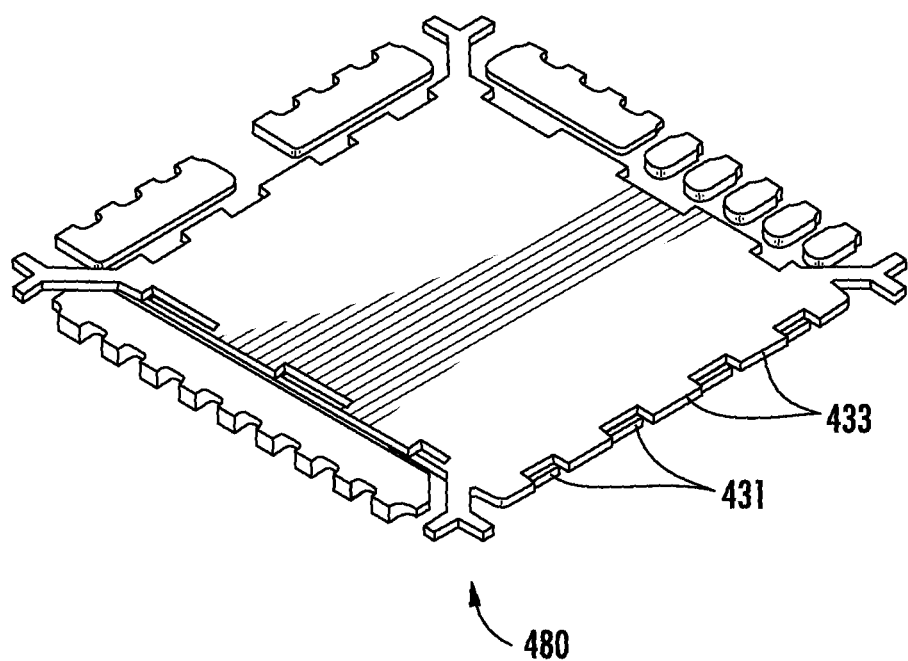
Figure 4E:
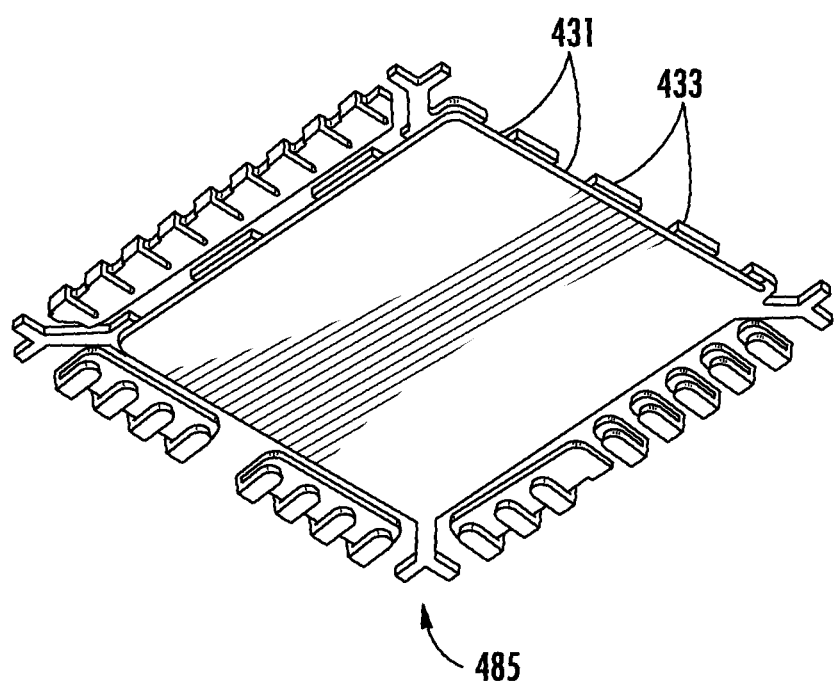
Figure 4F:
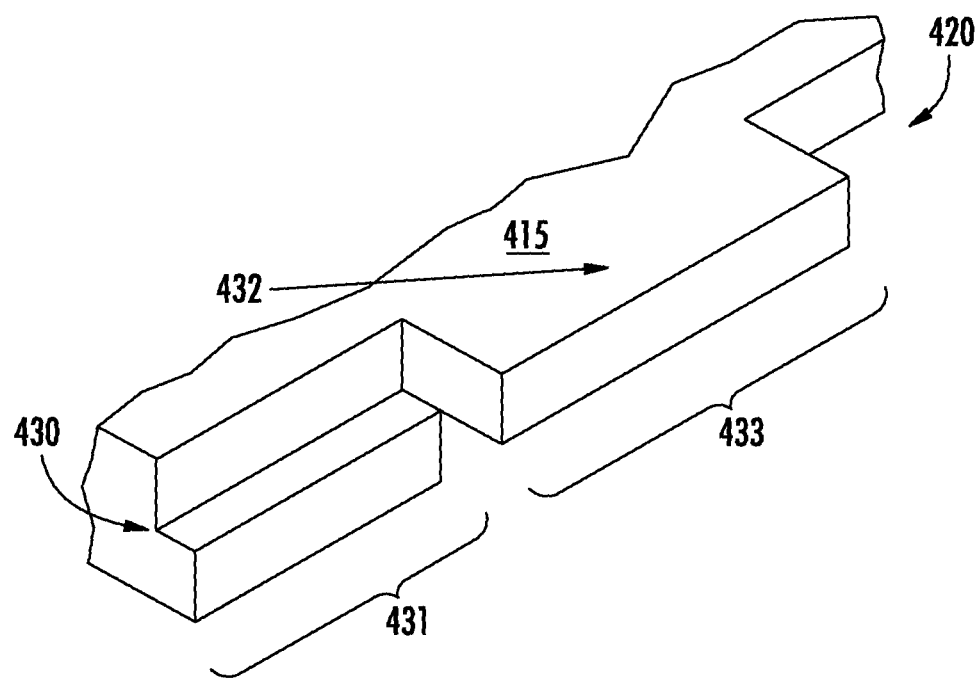

As illustrated in FIGS. 4D and 4E, by combining alternating surface breaking segments 431 and 433, the result is a discontinuous interface at the top of paddle 415 between the paddle 415 and molding compound 462 that incorporates both over-hanging top locking and step-out bottom locking feature profiles 110 and 120. FIG. 4D at 480 provides a top angled view of paddle 415. FIG. 4D at 485 provides a bottom angled view of paddle 415. FIG. 4F provides yet another view showing the spatial relationship between the step-out bottom profile of a segment 431 and an overhanging top profile of a segment 433 of paddle 415.

Figure 4G:
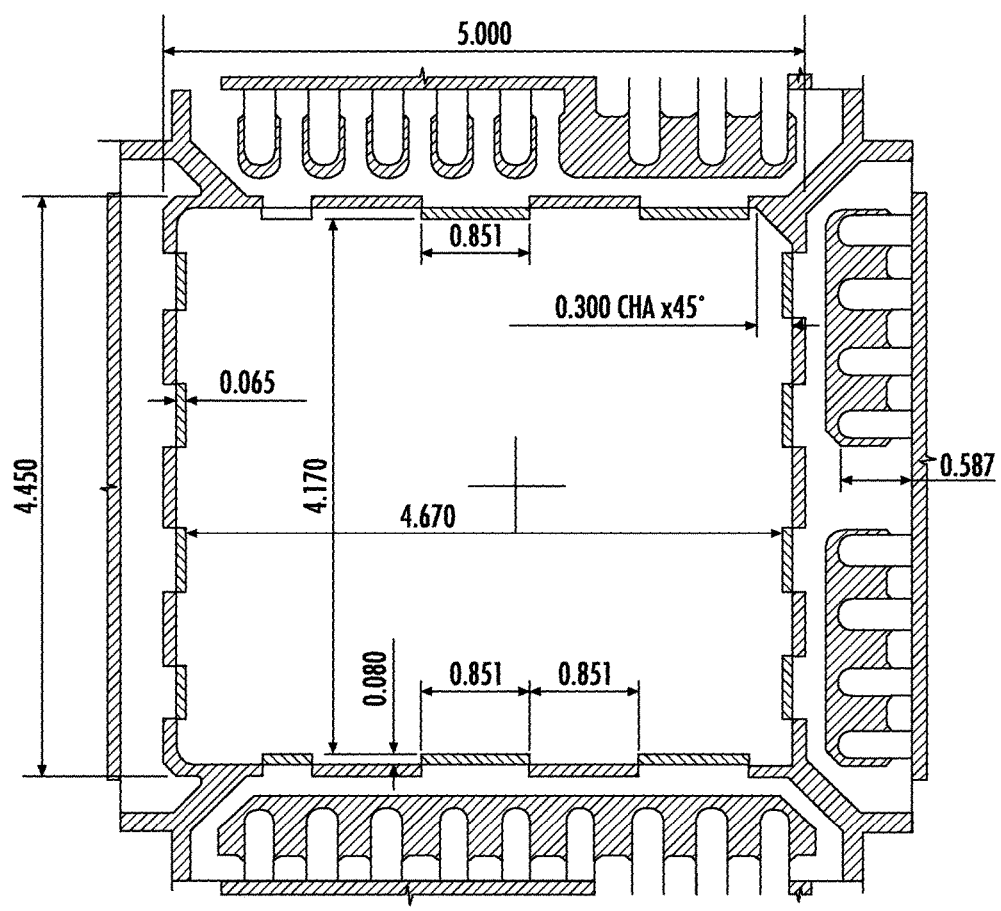

By combining alternating surface breaking segments of 431 and 433, the result is a discontinuous interface at the top of paddle 415 between paddle 415 and molding compound 462. As compared to the linear locking of FIGS. 2A and 2B, the surface tension required to cause delamination is increased due to the reduced shear stress achieved by the improved interlocking feature along the edge of the paddle 415. As compared to the linear locking of FIGS. 3A-C, the surface tension required to cause delamination and break the molding compound is also further increased. The discontinuous pattern provided by discontinuous over-hanging top locking feature 420 requires stresses at the molding compound-paddle interface to change direction to further propagate, further hindering such propagation. That is, the discontinuous shape design feature serves as a delamination stopper. If there is a localized delamination that occurs, the discontinuous locking feature will contain it preventing it from freely propagating. For this reason, the discontinuous shape locking feature also serves as to stop cracks from growing. Generally, the discontinuous shape locking feature facilitates mechanical interlocking between the molding compound and the lead frame at the interface at critical stress concentration areas where these elements interface. Thus the locking feature comprising of surface breaking alternating patterns along the edge of the die attach paddle 415 prevents package delamination and crack initiation and propagation by improving molding compound to paddle interlocking and stress redistribution. FIG. 4G illustrates a paddle 615 with discontinuous over-hanging top locking feature, shown at 620, for the purpose of illustrating exemplary dimensions.

Figure 5:
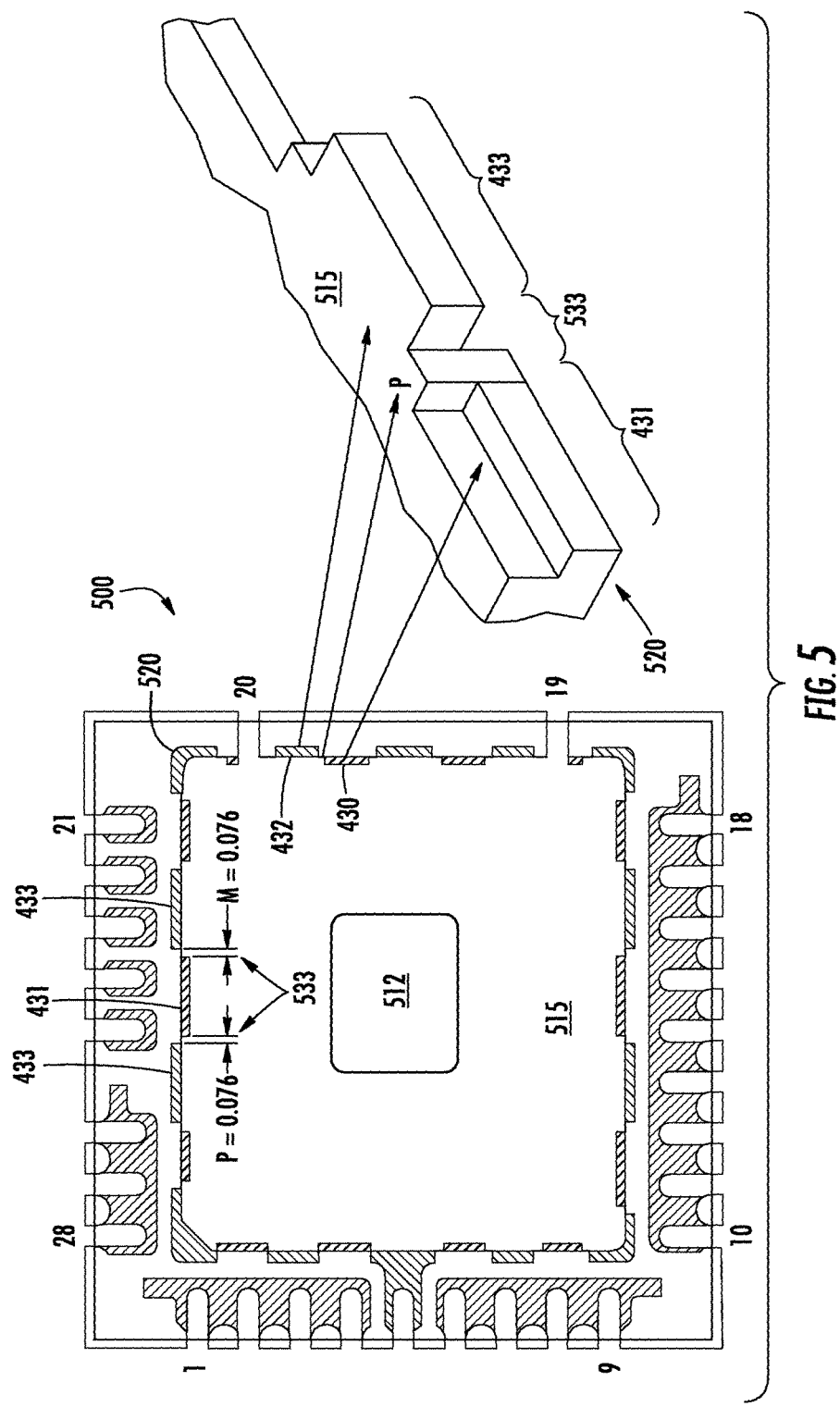
FIG. 5 is a diagram illustrating a variation on the embodiments presented by FIGS. 4A-4D.

FIG. 5 is a diagram illustrating an alternate embodiment of chip package 500 having a paddle 515 which provides an alternative discontinuous over-hanging top locking feature 520 to that described above with respect to FIGS. 4A-4C. In one embodiment, a die 512 is mounted to paddle 515. As illustrated in FIG. 5, discontinuous over-hanging top locking feature 520 includes segments 431 that comprise an over-hanging top locking feature profile 120 and segments 433 that comprise step-out bottom locking feature profile 130. Paddle 515's locking feature 520 further includes clearance gaps 533 located between each of the alternating segments 431 and 433. In one embodiment, clearance gaps 533 are portions of the edges of paddle 515 where a locking feature is not provided. FIG. 5 illustrates clearance gaps 533 as having dimensions of 0.076 mm. The inclusion of clearance gaps 533 is advantageous for manufacturing facilities that do not have processing equipment of sufficient precision to alternate between a over-hanging top locking feature profile 110 directly adjacent to a step-out bottom locking feature profile 120.

One of ordinary skill in the art would appreciate that any of the dimensions provided in this disclosure are for example purposes only and may be optionally utilized. They should not, however, be considered limiting with respect to other embodiments. Further, the term "partial etching" as has been used in this specification refers to etchings of any depth that do not penetrate through from one surface of a paddle to the opposing surface. For example, with respect to any of the embodiments described in this disclosure, an example depth for a partial etch from the top of a paddle would be on the order of 0.127 mm±0.050 mm while an example depth for a partial etch from the bottom of a paddle would be on the order of 0.100 mm±0.030 mm. Also, locking features using alternating discontinuous segments may have lengths along the paddle edges on the order of 0.150±0.006 mm, for example. However, locking features of other dimensions are contemplated and may be determined based on factors such as the dimensional scale of the overall chip package, the material characteristics of the molding compound being used, and thermal considerations under operation.

Figure 6A:
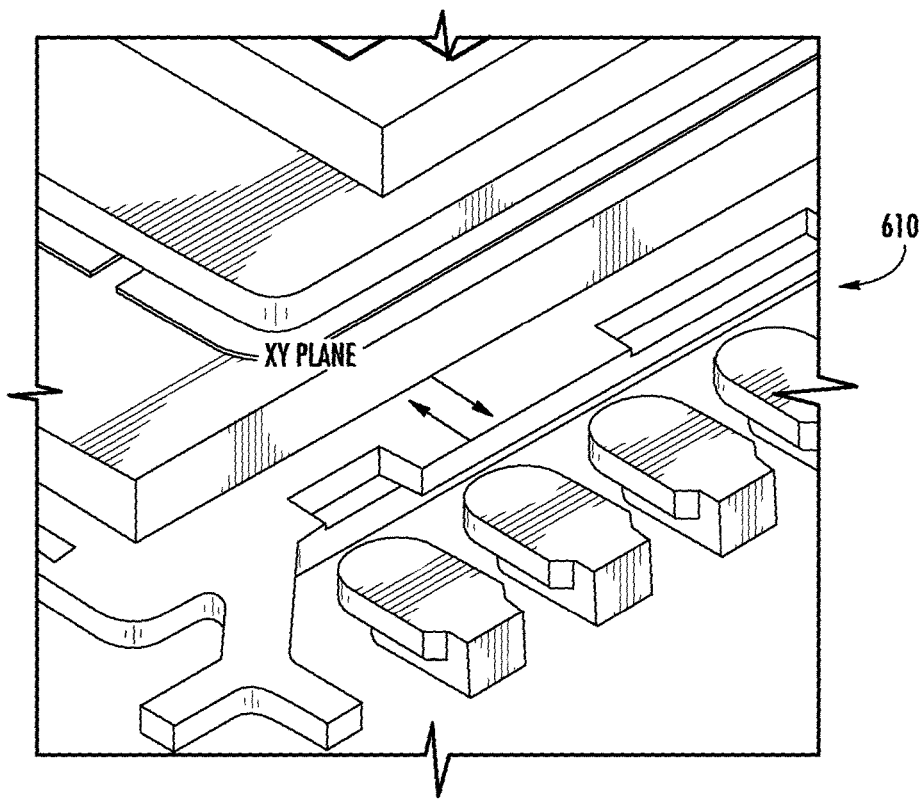
FIGS. 6A-6C are diagrams illustrating an example of one embodiment of a surface breaking locking feature with dimensions.
Figure 6B:
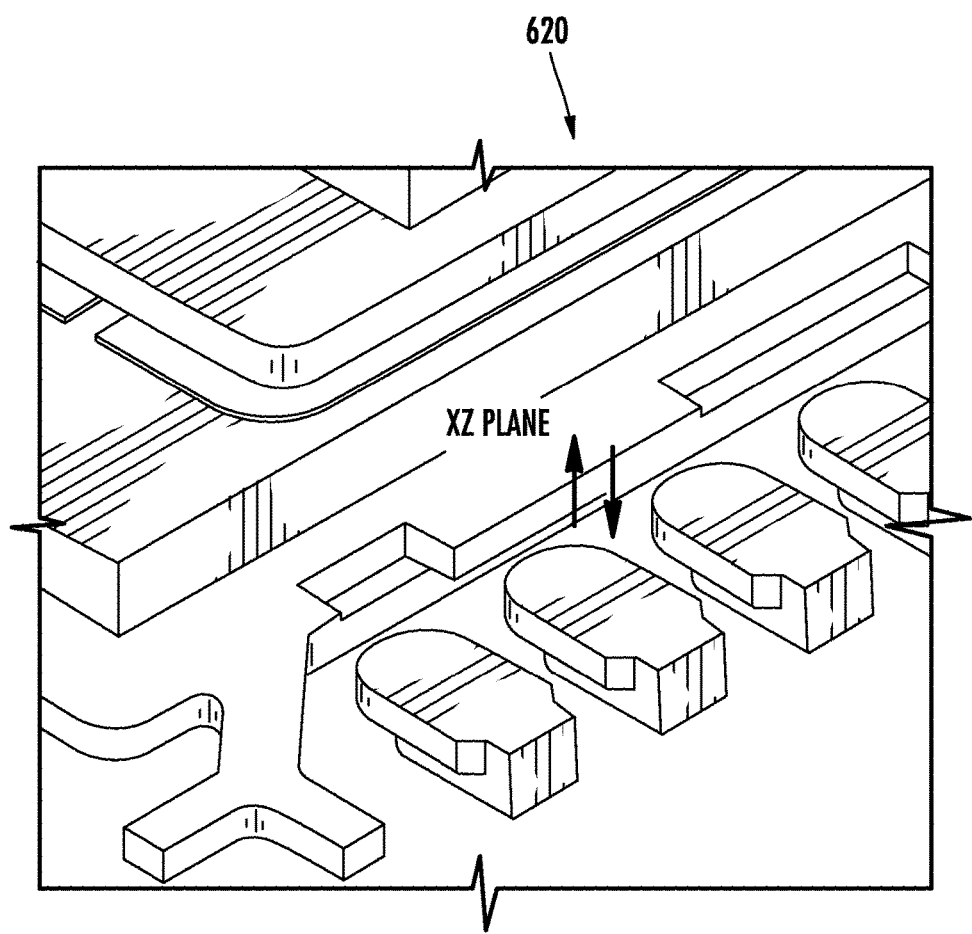
Figure 6C:
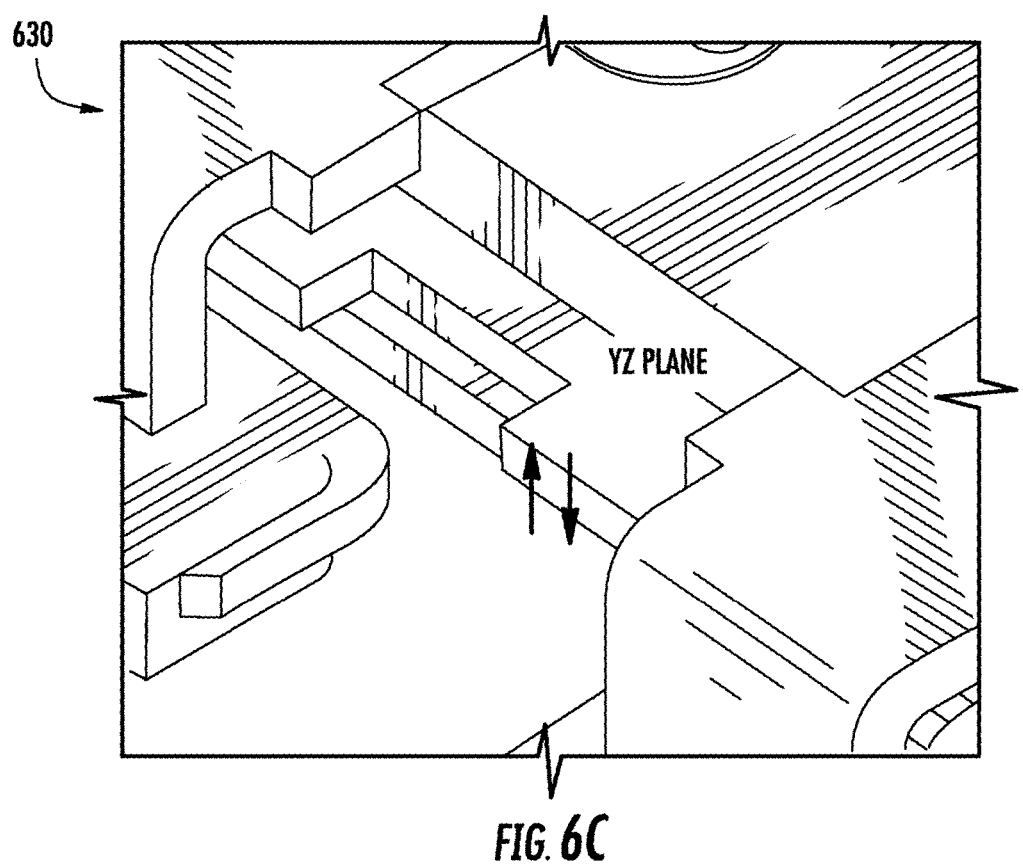

The advantage of utilizing alternating locking feature segments, such as discussed above with respect to paddles 415 and 515, is that they address stresses that occur within respect to all three dimensions, For example, as shown in FIG. 6A (as shown generally at 610), 6B (as shown generally at 620) and 6C (as shown generally at 630), the alternating segments of profile 611 provides discontinuities in each of the XY, XZ and YZ planes to prevent delamination and crack initiation in any of those planes.

Figure 7:
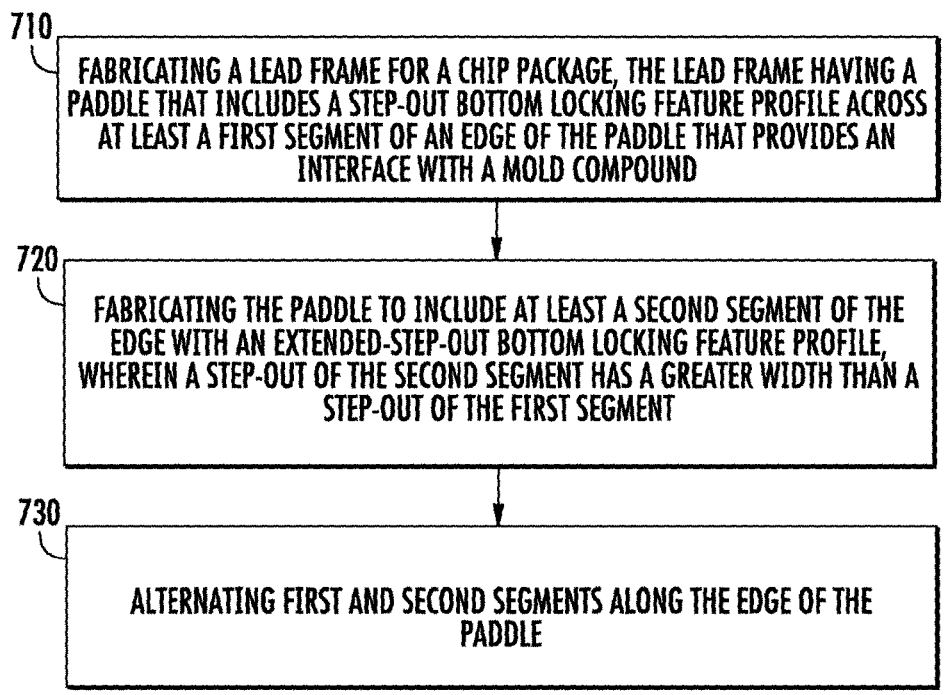
FIGS. 7 and 8 illustrate methods of one or more embodiments of the present invention.

FIG. 7 illustrates a method of one embodiment of the present invention using one or more of the locking feature profiles 110, 120 and 130 as described with respect to any of the above disclosed embodiments. The method begins at 710 with fabricating a lead frame for a chip package, the lead frame having a paddle that includes a step-out bottom locking feature profile across at least a first segment of an edge of the paddle that provides an interface with a mold compound. The method proceeds to 720 with fabricating the paddle to include at least a second segment of the edge with an extended-step-out bottom locking feature profile, wherein a step-out of the second segment has a greater width than a step-out of the first segment. By alternating first and second surface breaking segments along the edge of the paddle (shown at 730), a locking feature such as described with respect to FIG. 3A is provided.

Figure 8:
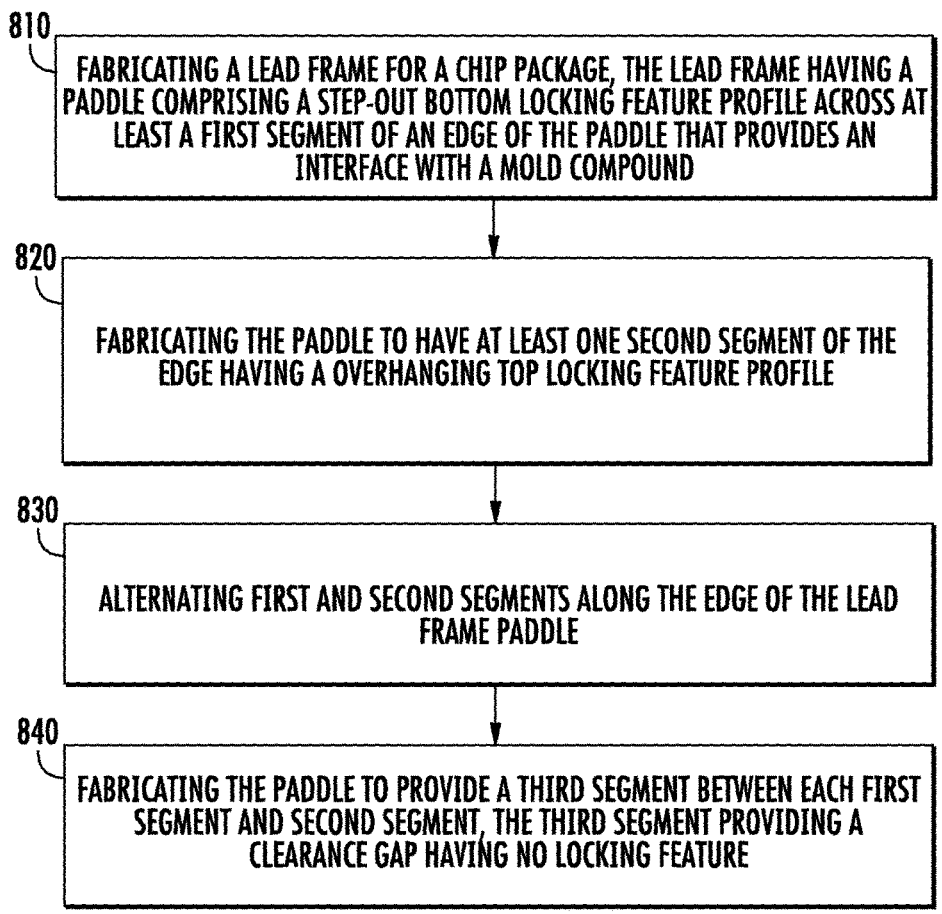

FIG. 8 illustrates another method of one embodiment of the present invention. The method begins at 810 with fabricating a lead frame for a chip package, the lead frame having paddle comprising a step-out bottom locking feature profile across at least a first segment of an edge of the paddle that provides an interface with a mold compound. The method proceeds to 820 with fabricating the paddle to have at least one second segment of the edge having a overhanging top locking feature profile. By alternating first and second surface breaking segments along the edge of the paddle (shown at 830), a locking feature such as described with respect to FIG. 4A is provided. In one embodiment, the method proceeds to 840 with providing a third segment between each first segment and second surface breaking segment that provides a clearance gap having no locking feature. In this way, a locking feature such as described with respect to FIG. 5A is provided.

Fabrication of the lead frame in either of the methods of FIG. 7 or 8 may include either etching or stamping of the lead frame to fabricate the step-out bottom locking feature for the first segment and the extended-step-out bottom locking feature profile for the second segment. The method may optionally proceed with encapsulating the paddle in a molding compound that secures the first segment and the second segment to the molding compound. In some embodiments, the paddle will further comprise at least one die mounted to the paddle. Thus the method may further comprise encapsulating the paddle and the at least one die in a molding compound that secures the first segment and the second segment to the molding compound. In some embodiment, the lead frame may include one or more secondary elements of the paddle that have an overhanging-top locking feature profile. Such secondary elements may also be encapsulated by and secured to the molding compound by the overhanging-top locking feature profile.

Figure 9:
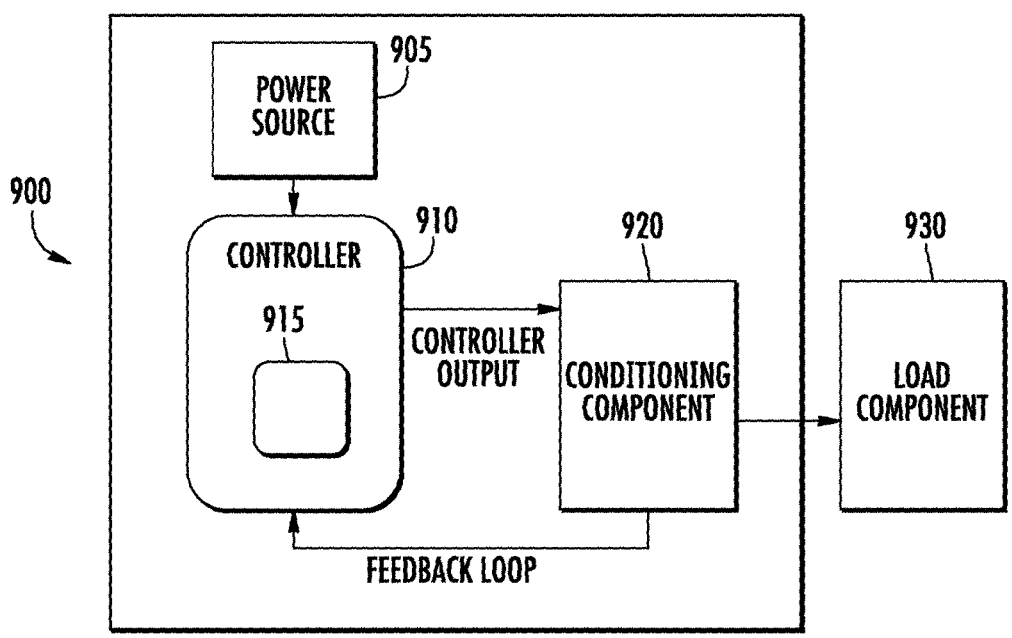
FIG. 9 illustrates a system of one embodiment of the present invention.

FIG. 9 illustrates a system 900 of one embodiment of the present invention comprising a controller 910 that includes a chip package 915 such as those described with respect to any of the embodiments described above. For example, in one embodiment, chip package 915 utilizes a linear step-out bottom locking feature. In another embodiment, chip package 915 utilizes a discontinuous step-out bottom locking feature that comprises alternating step-out bottom locking feature profiles and extended edge step-out bottom locking feature profiles. In yet another embodiment, chip package 915 utilizes a discontinuous overhanging top locking feature that comprises alternating step-out bottom locking feature profiles and overhanging-top locking feature profiles. In one such embodiment, clearance gap segments are provided between alternating segments of step-out bottom locking feature profiles and overhanging-top locking feature profiles. In still other embodiments, a chip package 915 having combinations of linear step-out bottom locking features, discontinuous step-out bottom locking feature, and discontinuous overhanging top locking features are utilized.

In one embodiment, controller 910 is a power controller. Controller 910 is powered from a power source 905 and in one embodiment provides an output to at least one component such as conditioning component 920. In one embodiment, controller 910 optionally receives a feedback loop signal from conditioning component 920 which may be used, for example, by chip package 915 to control the controller output. In one embodiment, system 900 provides an output to a load component 930 which is at least partially controlled by chip package 915. In some embodiments, the chip package 915 may comprise a high power or high speed operational amplifier (Op Amp).

Example Embodiments

Example 1 includes a chip package comprising: a lead frame; at least one die mounted to the lead frame; wherein at least a first portion of the lead frame has a locking feature comprising a step-out bottom locking feature profile; and a molding compound that encapsulates the lead frame and the at least one die; wherein the lead frame is secured to the molding compound by the locking feature.

Example 2 includes the chip package of Example 1, wherein the locking feature is a linear step-out bottom locking feature.

Example 3 includes the chip package of either of Examples 1 or 2, wherein the locking feature further includes a second portion of the lead frame that includes an extended edge step-out bottom locking feature profile.

Example 4 includes the chip package of Example 3 wherein the locking feature is a discontinuous step-out bottom locking feature.

Example 5 includes the chip package of any of Examples 1-4 wherein the locking feature further includes a second portion of the lead frame that includes an overhanging-top locking feature profile.

Example 6 includes the chip package of Example 5 wherein the locking feature is a discontinuous overhanging top locking feature.

Example 7 includes the chip package of Example 5 wherein the locking feature further includes a third portion comprising a clearance gap segment between the overhanging-top locking feature profile and the step-out bottom locking feature profile.

Example 8 includes the chip package of any of Examples 5-7, further comprising one or more secondary elements having an overhanging-top locking feature profile, wherein the one or more secondary elements are secured to the molding compound by the overhanging-top locking feature profile.

Example 9 includes a method comprising: etching a paddle for a chip package to have a step-out bottom locking feature profile across at least a first segment of an edge of the paddle that interfaces with a mold compound; etching the paddle to have at least a second segment of the edge having an extended-step-out bottom locking feature profile, wherein a step-out of the second segment has a greater width than a step-out of the first segment; and alternating first and second segments along the edge of the paddle.

Example 10 includes the method of Example 9, further comprising: securing at least one die to the paddle.

Example 11 includes the method of any of Examples 9-10 further comprising: encapsulating the paddle and the at least one die in a molding compound that secures the first segment and the second segment to the molding compound.

Example 12 includes the method of Example 11 further comprising: partially etching one or more secondary elements of the paddle to have an overhanging-top locking feature profile, wherein the one or more secondary elements are secured to the molding compound by the overhanging-top locking feature profile.

Example 13 includes a method comprising: etching a paddle for a chip package to have a step-out bottom locking feature profile across at least a first segment of an edge of the paddle that interfaces with a mold compound; etching the paddle to have at least one second segment of the edge having a overhanging top locking feature profile; alternating first and second segments along the edge of the paddle.

Example 14 includes the method of Example 13 further comprising: etching the paddle to provide a third segment between each first segment and second segment, the third segment providing a clearance gap having no locking feature.

Example 15 includes the method of any of Examples 13-14 further comprising: securing at least one die to the paddle.

Example 16 includes the method of Example 15 further comprising: encapsulating the paddle and the at least one die in a molding compound that secures the first segment and the second segment to the molding compound.

Example 17 includes the method of Example 16 further comprising: partially etching one or more secondary elements of the paddle to have an overhanging-top locking feature profile, wherein the one or more secondary elements are secured to the molding compound by the overhanging-top locking feature profile.

Example 18 includes a system comprising: a power source; a controller having a chip package that includes at least one die mounted to a lead frame, wherein a least a first portion of the lead frame has a locking feature comprising at least a step-out bottom locking feature profile; and a component to receive an output of the controller.

Example 19 includes the system of Example 18 wherein the locking feature further includes a second portion of the lead frame that includes an extended edge step-out bottom locking feature profile.

Example 20 includes the system of any of Examples 18-19 wherein the locking feature further includes a second portion of the lead frame that includes an overhanging-top locking feature profile.

Example 21 includes the system of Example 20 wherein the locking feature is a discontinuous overhanging top locking feature.

Example 22 includes the system of any of Examples 20-21 wherein the locking feature further includes a third portion comprising a clearance gap segment between the overhanging-top locking feature profile and the step-out bottom locking feature profile.

Example 23 includes the system of any of Examples 20-22, wherein controller receives a feedback signal from the component utilized by the chip package to control the output of the controller.

Example 24 includes the system of any of Examples 18-23 the chip package further comprising: a molding compound that encapsulates the lead frame and the at least one die; wherein the lead frame is secured to the molding compound by the locking feature.

Example 25 includes the system of Example 24, the chip package further comprising one or more secondary elements having an overhanging-top locking feature profile, wherein the one or more secondary elements are secured to the molding compound by the overhanging-top locking feature profile.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," "bottom" and "under" are defined with respect to the conventional plane or working surface being on the top surface of the wafer, substrate or leadframe, regardless of the orientation of the wafer or substrate. Dimensions are provided for illustrative purposes and are not to be considered limiting.

Although specific embodiments have been illustrated and described herein, it will be appreciated by those of ordinary skill in the art that any arrangement, which is calculated to achieve the same purpose, may be substituted for the specific embodiment shown. Elements of each embodiment described above can be combined with each other to provide still further embodiments. This application is intended to cover any adaptations or variations of the present invention. Therefore, it is manifestly intended that this invention be limited only by the claims and the equivalents thereof.

What is claimed is:

1. A chip package comprising:
a lead frame having a paddle;
wherein at least a first portion of the lead frame has a locking feature comprising a step-out bottom locking feature profile, wherein the locking feature further includes a second portion of the lead frame that includes an overhanging-top locking feature profile;

wherein the locking feature further includes a third portion comprising a clearance gap segment between the overhanging-top locking feature profile and the step-out bottom locking feature profile, wherein the first, second and third portions are disposed on a common single edge of the lead frame such that the clearance gap segment establishes a gap between the overhanging-top locking feature profile and the step-out bottom locking feature profile on the common single edge of the lead frame; and a molding compound that encapsulates the lead frame and the at least one die;

wherein the lead frame is secured to the molding compound by the locking feature.

2. The chip package of claim 1, further comprising at least one die mounted to the paddle.

3. The chip package of claim 1, wherein the locking feature is a discontinuous overhanging top locking feature.

4. The chip package of claim 1, further comprising one or more secondary elements having an overhanging-top locking feature profile, wherein the one or more secondary elements are secured to the molding compound by the overhanging-top locking feature profile.

5. The chip package of claim 1, wherein the clearance gap segment is an edge segment that does not interlock with the molding compound.

6. A system comprising:

a power source;

a controller having a chip package that includes at least one die mounted to a lead frame, wherein a least a first portion of the lead frame has a locking feature comprising at least a step-out bottom locking feature profile, wherein the locking feature further includes a second portion of the lead frame that includes an overhanging-top locking feature profile;

wherein the locking feature further includes a third portion comprising a clearance gap segment between the overhanging-top locking feature profile and the step-out bottom locking feature profile, wherein the first, second and third portions are disposed on a common single edge of the lead frame such that the clearance gap segment establishes a gap between the overhanging-top locking feature profile and the step-out bottom locking feature profile on the common single edge of the lead frame; and a component to receive an output of the controller.

7. The system of claim 6, wherein the locking feature is a discontinuous overhanging top locking feature.

8. The system of claim 6, wherein controller receives a feedback signal from the component utilized by the chip package to control the output of the controller.

9. The system of claim 6, the chip package further comprising:

a molding compound that encapsulates the lead frame and the at least one die;

wherein the lead frame is secured to the molding compound by the locking feature.

10. The system of claim 9, the chip package further comprising one or more secondary elements having an overhanging-top locking feature profile, wherein the one or more secondary elements are secured to the molding compound by the overhanging-top locking feature profile.

11. The system of claim 6, wherein the chip package further includes a molding compound, and wherein the clearance gap segment is an edge segment that does not interlock with the molding compound.

* * * * *